US008964115B2

(12) United States Patent
Eggert (10) Patent No.: US 8,964,115 B2
(45) Date of Patent: Feb. 24, 2015

(54) TRANSMISSION CAPACITY PROBING USING ADAPTIVE REDUNDANCY ADJUSTMENT

(75) Inventor: Lars René Eggert, Helsinki (FI)

(73) Assignee: Nokia Corporation, Espoo (FI)

( * ) Notice: Subject to any disclaimer, the term of this patent is extended or adjusted under 35 U.S.C. 154(b) by 831 days.

(21) Appl. No.: 12/494,799

(22) Filed: Jun. 30, 2009

(65) Prior Publication Data

US 2010/0328528 A1    Dec. 30, 2010

(51) Int. Cl.
| | |
|---|---|
| H04N 11/02 | (2006.01) |
| H03M 13/35 | (2006.01) |
| H04N 21/2343 | (2011.01) |
| H04N 21/24 | (2011.01) |
| H04L 29/06 | (2006.01) |
| H03M 13/13 | (2006.01) |
| H03M 13/23 | (2006.01) |
| H03M 13/29 | (2006.01) |

(52) U.S. Cl.
CPC ......... *H03M 13/356* (2013.01); *H04N 21/2343* (2013.01); *H04N 21/2402* (2013.01); *H04L 65/80* (2013.01); *H03M 13/13* (2013.01); *H03M 13/23* (2013.01); *H03M 13/2957* (2013.01)
USPC ........ 348/425.2; 370/328; 370/329; 714/758; 714/790

(58) Field of Classification Search
CPC ....................................................... H04L 65/80
USPC ..................................................... 348/425.2
See application file for complete search history.

(56) References Cited

U.S. PATENT DOCUMENTS

| | | | | |
|---|---|---|---|---|
| 4,047,151 | A * | 9/1977 | Rydbeck et al. | 714/774 |
| 5,214,656 | A * | 5/1993 | Chung et al. | 714/758 |
| 6,535,558 | B1 * | 3/2003 | Suzuki et al. | 375/240.12 |
| 6,816,194 | B2 * | 11/2004 | Zhang et al. | 375/240.27 |

(Continued)

FOREIGN PATENT DOCUMENTS

| | | |
|---|---|---|
| WO | 97/36377 A1 | 10/1997 |
| WO | 2008/039201 A1 | 4/2008 |

OTHER PUBLICATIONS

International Search Report and Written Opinion received in corresponding Patent Cooperation Treaty Application No. PCT/FI2008/000083, Mar. 5, 2009, 16 pages.
Verdu, Sergio, "Wireless Bandwidth in the Making", IEEE Communications Magazine, Jul. 2000, pp. 53-58.

(Continued)

*Primary Examiner* — William C Vaughn, Jr.
*Assistant Examiner* — Luis M Perez
(74) *Attorney, Agent, or Firm* — Harrington & Smith (57) ABSTRACT

In accordance with an example embodiment of the present invention, there is provided an apparatus configured to instruct a redundancy encoder to increase a level of redundancy of a media stream, an error rate determination to determine an error rate of a communication path conveying the media stream with increased redundancy, a comparator configured to compare a bandwidth used to convey the encoded media stream at the increased redundancy level with a bandwidth for conveying the encoded media stream at a second quality level greater than the first quality level, the apparatus being further configured to provide a switching signal to a media encoder to start encoding the media stream at the second quality level responsive to the used bandwidth being sufficient for conveying the media stream encoded at the second quality level and the determined error rate being less than a predetermined threshold value.

21 Claims, 2 Drawing Sheets

(56) References Cited

U.S. PATENT DOCUMENTS

| | | | |
|---|---|---|---|
| 6,968,494 B2* | 11/2005 | Zhang | 714/790 |
| 7,818,779 B2* | 10/2010 | Matsuzaki et al. | 725/143 |
| 7,904,795 B2* | 3/2011 | Liao et al. | 714/784 |
| 7,940,644 B2* | 5/2011 | Oran et al. | 370/216 |
| 8,102,801 B2* | 1/2012 | Kwak | 370/328 |
| 8,422,439 B2* | 4/2013 | Nimbalker et al. | 370/329 |
| 8,687,566 B2* | 4/2014 | Maas et al. | 370/329 |
| 2003/0169813 A1* | 9/2003 | Van Der Schaar | 375/240.12 |
| 2007/0223449 A1 | 9/2007 | Nagai | |
| 2007/0223582 A1* | 9/2007 | Borer | 375/240.12 |
| 2009/0052540 A1* | 2/2009 | Gutman et al. | 375/240.24 |
| 2010/0202284 A1* | 8/2010 | Tidestav | 370/216 |
| 2010/0306810 A1* | 12/2010 | Brooks et al. | 725/109 |

OTHER PUBLICATIONS

Chakareski, Jacob, et al., "Adaptive Systems for Improved Media Streaming Experience", IEEE Communications Magazine, Jan. 2007, pp. 77-83.

Stewart, R., "Stream Control Transmission Protocol", RFC 4960, Sep. 2007, 152 pgs.

Kohler, E., et al., "Datagram Congestion Control Protocol (DCCP)", RFC 4340, Mar. 2006, 129 pgs.

Postel, J., "Transmission Control Protocol", STD 7, RFC 793, Sep. 1981, 85 pgs.

Handley, M., et al., "TCP Friendly Rate Control (TFRC): Protocol Specification", RFC 3448, Jan. 2003, 24 pgs.

* cited by examiner

TRANSMISSION CAPACITY PROBING USING ADAPTIVE REDUNDANCY ADJUSTMENT

RELATED APPLICATIONS

This application was originally filed as and claims priority to PCT/FI2008/000083 filed on 30 Jun. 2008.

TECHNICAL FIELD

The present application relates generally to transmitting coded media information using more than one quality level.

BACKGROUND

IP-based networks in general do not employ reservation schemes to isolate different communication sessions from one another. This means that applications may need to use appropriate congestion control mechanisms when communicating over internet protocol (IP) paths. Such mechanisms are usually designed to protect the IP-based network from excessive congestion and establish at least some fairness between concurrent transmissions that share at least part of the same path. Many applications do this by using a transport protocol that inherently provides such congestion control. Some applications use the transmission control protocol (TCP), some use the stream control transmission protocol (SCTP) or the datagram congestion control protocol (DCCP). Other applications choose to implement appropriate congestion control inside the application itself, for example, by following the TCP friendly rate control (TFRC) algorithm. Although effective for bulk data transmissions, these protocols may not be optimally suited to stream live or pre-recorded media traffic over the Internet.

SUMMARY

Various aspects of the invention are set out in the claims.

In accordance with an example embodiment of the present invention, there is provided an apparatus comprising an encoding control unit configured to instruct a redundancy encoder to increase a level of redundancy of an encoded media stream, an error rate determination unit configured to determine an error rate of a communication path conveying the encoded media stream with increased redundancy, a comparator configured to compare a bandwidth used to convey the encoded media stream at the increased redundancy level with a bandwidth for conveying the encoded media stream at a second quality level greater than the first quality level, the encoding control unit being further configured to provide a switching signal to a media encoder to start encoding the media stream at the second quality level responsive to the used bandwidth being sufficient for conveying the media stream encoded at the second quality level and the determined error rate being less than a predetermined threshold value.

In accordance with another example embodiment of the present invention, there is provided a method comprising increasing a level of redundancy of an encoded media stream, determining an error rate of a communication path conveying the encoded media stream with increased redundancy, comparing a bandwidth used to convey the encoded media stream at the increased redundancy level with a bandwidth for conveying the encoded media stream at a second quality level greater than the first quality level and, responsive to the used bandwidth being sufficient for conveying the media stream encoded at the second quality level and the determined error rate being less than a predetermined threshold value, providing a switching signal to a media encoder to start encoding the media stream at the second quality level.

In certain embodiments of the invention, the apparatus is configured to increase the level of redundancy in stages, wherein the redundancy is increased more than once to increase the bandwidth required to a level which is sufficient for conveying the media stream at the second quality level.

BRIEF DESCRIPTION OF THE DRAWINGS

For a more complete understanding of example embodiments of the present invention, the objects and potential advantages thereof, reference is now made to the following descriptions taken in connection with the accompanying drawings in which.

DETAILED DESCRIPTION OF THE DRAWINGS

Example embodiments of the present invention and its potential technical effects are best understood by referring to FIGS. 1 through 5 of the drawings, like numerals being used for like and corresponding parts of the various drawings.

Figure 1:
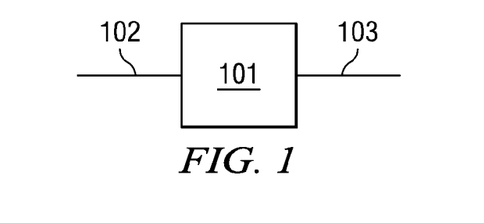
FIG. 1 illustrates a media encoder.

FIG. 1 illustrates a media encoder. Encoder 101 is configured to convert a stream of media data into an encoded media stream, for example for transmission over a transmission path which may introduce errors. The encoding performed by encoder 101 may be directed, for example, towards reducing the number of bits required to represent the media stream, allowing a receiver to detect errors incurred during transmission from a transmitter to the receiver, or allowing a receiver to correct such errors, or any combination of these techniques. Encoding directed towards reducing the number of bits required to represent a media stream may be referred to as source coding or compression coding. Encoding directed towards allowing a receiver to detect errors incurred during transmission may be referred to as error detection coding, while encoding directed towards allowing a receiver to correct errors in received data may be referred to as error correction coding. Collectively, error detection coding and error correction coding may be referred to as redundancy coding. In general, the term redundancy coding may be used to describe any form of encoding in which an encoded bitstream includes redundant information.

Examples of encoding techniques an encoder may use are, for example, convolutional coding, block-based coding and turbo coding. Encoding techniques may also be designed specifically for the encoding of particular types of media, such as JPEG encoding for images, MPEG-2 or MPEG-4 encoding for video and MP3 encoding for sound. The media data to be encoded may be divided into a series of finite units, referred to as frames, and encoding may be applied to the media data frame by frame. In video coding, a frame may correspond with an individual picture of a sequence of pictures to be encoded. In audio or speech coding, for example, a frame may correspond with a certain period of time (e.g. 20 ms) over which the statistical properties of the signal may be assumed substantially constant. Video media may be encoded so that the encoded media stream comprises also audio, if the media input comprises both video and audio. Definitions of the mentioned encoding formats are available to the skilled person.

Returning to consideration of FIG. 1, media input 102 provides media content to media encoder 101, which converts the media content into an encoded media stream. The encoded media stream is carried by an output from the encoder, 103. The encoded media stream may be transmitted to a receiver, or to more than one receiver, using a transport protocol such as, for example, TCP. The receiver may be coupled to a decoder that may be capable of reversing the encoding, a process known as decoding. After decoding, the media stream may be in a form suitable for presentation to a human via a user interface, for example.

The encoder 101 may reside in an apparatus such as a mobile terminal, a network server, network node or the like. The apparatus comprising the encoder may be connected to a packet-switched network by a wired or wireless communication connection. The apparatus may comprise a media capture device, for example a video camera or a microphone, which may be configured to provide media data to the encoder via media input 102. Alternatively, or additionally, the apparatus may be in communication with a further apparatus and receive media data as input therefrom. An example apparatus hosting the encoder is a cellular mobile telephone, which may be configured to communicate with a cellular communications network. The cellular mobile telephone may, for example, be capable of making and/or receiving a video or audio call over the cellular communications network by sending and respectively receiving encoded media streams.

The encoder 101 may be implemented in hardware as an integrated circuit apparatus such as a general-purpose processor, a controller, field-programmable gate array (FPGA), application-specific integrated circuit (ASIC), or as dedicated circuitry inside a multi-purpose processor or digital signal processor DSP. Alternatively, the encoder may be implemented as software running on a programmable device such as processor or DSP, or as a combination of software and hardware. An example of such a combination is e.g. a DSP configured to run executable program code and comprising circuitry dedicated to accelerating a computationally intensive part of an encoding process.

As explained above, certain forms of encoding, referred to generally as redundancy coding techniques, add redundant information to media content to produce an encoded media stream. The redundancy information added by redundancy coding may be used by a corresponding decoder coupled to a receiver to detect and/or correct errors incurred when the encoded media stream is transmitted to the receiver over an error-prone communication path. The errors incurred may comprise, for example, bit errors and/or packet losses.

Redundancy coding increases the bandwidth used to transmit an encoded media stream, since redundancy bits are transmitted in addition to bits carrying actual media information, also known as payload bits. The used bandwidth is thus the sum of the bandwidth used to carry the payload bits and the bandwidth used to carry the redundancy bits. Some forms of redundancy coding repeat at least some of the payload bits. In other forms of redundancy coding, the redundancy bits are determined from the payload bits using some form of mathematical calculation, for example a predefined polynomial function. Forward error correction (FEC) and convolutional encoding are examples of this latter type of redundancy coding technique. Redundancy coding may be applied to a media stream in addition to source encoding.

Each frame of the encoded media stream may comprise both payload and redundancy bits. The ratio of redundancy bits to payload bits may be varied. If the number of redundancy bits is increased, the corresponding decoder that receives the encoded media stream may be capable of correcting more errors per frame in the payload bits, or perhaps recover from frame loss, if the encoding applies redundancy across frame boundaries, for example. There thus exists a tradeoff between sending more redundancy bits to improve error-correcting or detection ability, and expending bandwidth to convey the redundancy bits.

The quality level of an encoded media stream may be affected by parameters of the source encoding applied to the media stream. For example, the quality of an encoded audio stream may be determined at least in part by a sampling rate used to digitize an audio signal. As another example, the quality of an encoded video stream may be determined at least in part by any one of, or any combination of, resolution, frame rate, color depth, degree of interpolation and/or the like. Additionally, or alternatively, the quality of an encoded audio or video stream may be determined at least in part by an applied level of quantization. A media input may comprise more than one kind of media, for example it may comprise a combination of audio and video. Bandwidth requirements may vary according to the defined quality level of the encoded media stream.

A higher quality encoded media stream may use more bandwidth than a lower quality encoded media stream. A media encoder may be configured to change the quality level of the media streams it encodes. If transmission capacity of a communication path, for example an IP path, degrades, it may be necessary to reduce the quality level so that the bandwidth used is reduced to a level that the degraded communication path can provide. Thus, the used bandwidth may depend on both the selected quality level and the level of redundancy applied. Transmitting a higher-quality encoded media stream over a path that incurs very few errors may require the same bandwidth as transmitting a lower-quality encoded media stream over a link that incurs more errors or packet losses. This is because the lower-quality encoded media stream in this example uses more redundancy bits for it to be conveyed correctly over this error-prone path.

Figure 2:
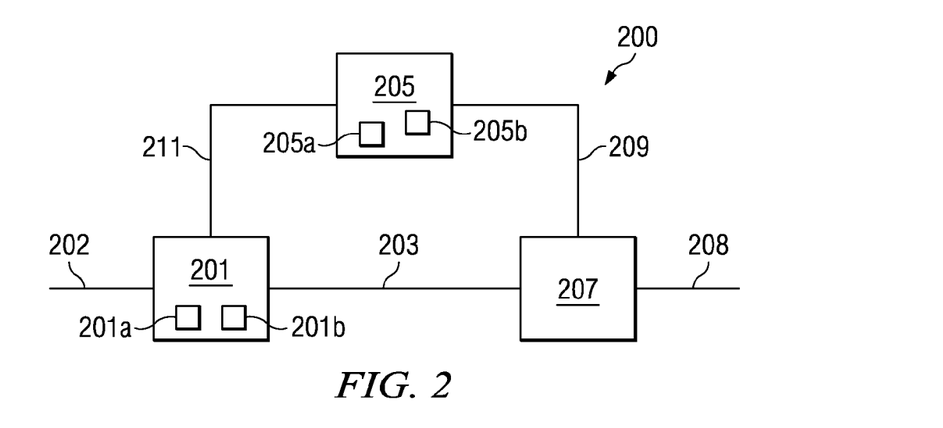
FIG. 2 illustrates apparatus for probing transmission capacity according to a first embodiment of the invention.

FIG. 2 illustrates an apparatus 200 for probing transmission capacity according to a first embodiment of the invention. The apparatus comprises a media encoder 201 having an input 202 and an output 203. Media data for encoding is received at input 202 and encoded media data is provided at output 203. The apparatus further comprises an encoding control unit 205 and a transmitter 207. In the embodiment of FIG. 2, media encoder 201 comprises a source encoder 201a configured to apply an adjustable level of source coding to media data received on input 202, thereby enabling the media data to be encoded at different quality levels. Encoder 201 further comprises a redundancy encoder 201b configured to apply an adjustable level of redundancy coding to the encoded media data.

Transmitter 207 is configured to receive an encoded media stream from the output 203 of encoder 201 and to transmit it to a communication path 208. The transmitter 207 is coupled to the encoding control unit 205 via control line 209.

The encoding control unit 205 further comprises an error rate determination unit 205a and a bandwidth comparator 205b. Encoding control unit 205 is coupled to the encoder 201 via control line 211.

In the embodiment of FIG. 2, encoding control unit 205 is configured to control the operation of media encoder 201. In particular, the encoding control unit 205 may effect changes in the number of redundancy bits included in the encoded media stream by redundancy encoder 201b. Encoding control unit 205 may also control source encoder 201a to change the quality level of source encoding applied to the media stream.

The error rate determination unit 205a is configured to determine an error rate in communication over the communication path 208. The error rate determination unit 205a may receive an indication of the error rate from the transmitter 207 via control line 209. The transmitter 207 may be configured to measure the error rate over the communication path or may alternatively receive an indication of the error rate via the communication path 208 from a receiver. The measured or indicated error rate may be any appropriate error rate measure, including but not limited to, an instantaneous or average error rate, a bit error rate, a packet loss rate, a frame error rate, or a frame loss rate. Alternatively, error rate determination unit 205a may be configured to calculate an instantaneous or average error rate based at least in part on information relating to bit errors, packet losses, frame errors, frame losses and/or the like received from the transmitter via control line 209.

The units illustrated in FIG. 2 may be implemented in software, hardware and/or a combination of software and hardware. One or more of the units depicted as separate in the figure may be comprised in a single physical apparatus. Furthermore, in alternative embodiments, units illustrated as forming part of a combined functional unit may be implemented as separate units. In embodiments of the invention, source encoder 201a may be any form of source encoder configured to encode media data at an adjustable quality level, including but not limited to, an audio encoder, a speech encoder, a still image encoder, a video encoder, or any combination thereof.

Figure 3:
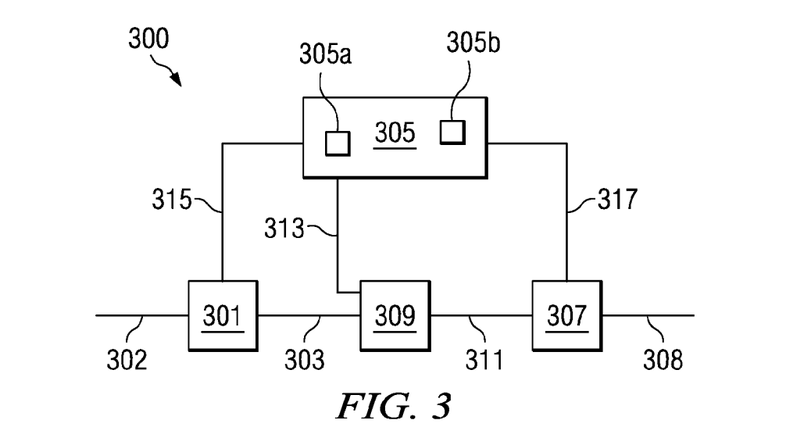
FIG. 3 illustrates apparatus for probing transmission capacity according to a second embodiment of the invention.

FIG. 3 illustrates an apparatus for probing transmission capacity according to a second embodiment of the invention. The apparatus comprises a media encoder 301, having an input 302 and an output 303. Media data for encoding is received at input 302 and encoded media data is provided at output 303. The apparatus further comprises an encoding control unit 305, a transmitter 307 and a redundancy encoder 309. In the embodiment of FIG. 3, media encoder 301 is a source encoder configured to apply an adjustable level of source coding to media data received on input 302, thereby enabling the media data to be encoded at different quality levels. Redundancy encoder 309 is configured to receive a source encoded media stream from output 303 of media encoder 301, and to apply an adjustable level of redundancy encoding, for example FEC coding, to the source encoded media stream. The redundancy encoder 309 is further configured to provide the encoded media stream with both source encoding and redundancy encoding to the transmitter 307 via connection 311.

Transmitter 307 is configured to receive the encoded media stream and to transmit it to communication path 308. The transmitter 307 is coupled to the encoding control unit 305 via control line 317.

The encoding control unit 305 comprises an error rate determination unit 305a and a bandwidth comparator 305b. Encoding control unit 305 is coupled to media encoder 301 via control line 315 and to redundancy encoder 309 via control line 313.

In the embodiment of FIG. 3, encoding control unit 305 is configured to control the operation of media encoder 301 via control line 315 and to control the operation of redundancy encoder 309 via control line 313. In particular, the encoding control unit 305 may effect changes in the number of redundancy bits included in the media stream by redundancy encoder 309. Encoding control unit 305 may also control media encoder 301 to change the quality level of source encoding applied to the media stream. The error rate determination unit 305a of FIG. 3 is configured as described above in conjunction with FIG. 2.

The units illustrated in FIG. 3 may be implemented in software, hardware and/or a combination of software and hardware. One or more of the units depicted as separate in the figure may be comprised in a single physical apparatus. Furthermore, in alternative embodiments, units illustrated as forming part of a combined functional unit may be implemented as separate units. In embodiments of the invention, media encoder 301 may be any form of source encoder configured to encode media data at an adjustable quality level, including but not limited to, an audio encoder, a speech encoder, a still image encoder, a video encoder, or any combination thereof.

Figure 4:
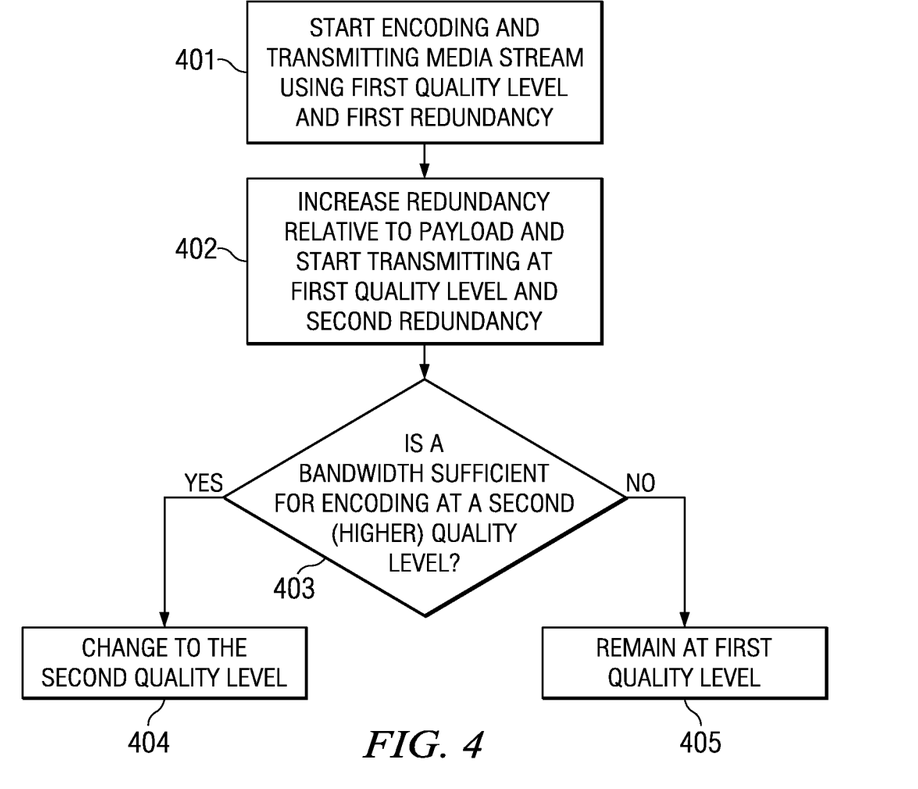
FIG. 4 is a flowchart illustrating method steps of a process according to an embodiment of the invention.

FIG. 4 is a flowchart illustrating a method for probing transmission capacity according to an embodiment of the invention. The method will first be described in connection with the embodiment of apparatus for probing transmission capacity illustrated in FIG. 2.

In block 401, media encoder 201, starts encoding media data received at input 202 into a first encoded media stream having a first quality level and a first level of redundancy. As previously described, the first quality level may be defined by selecting particular source encoding parameters to be applied to the media data by source encoder 201a. Depending on the type of media data being encoded, the selected source encoding parameters may include but may not be limited to any one or any combination the following parameters: a data sampling rate, a frame rate, a picture resolution, a level of quantization, a number of encoding parameters, a psychoacoustic model. The first level of redundancy may be defined by adding a first predetermined number of redundancy bits to the encoded media data in redundancy encoder 201b.

The first encoded media stream is provided from media encoder 201 to transmitter 207 via output line 203. Transmitter 207 starts to transmit the first encoded media stream. A certain bandwidth is used to convey this media stream, which contains both payload and redundancy bits. In one embodiment, the first predetermined number of redundancy bits may be zero, in which case the coded media stream does not contain redundancy bits.

In block 402, encoding control unit 205 sends a command to redundancy encoder 201b of media encoder 201 via control line 211 to increase the redundancy level in the encoded media stream. Responsive to receiving the command from encoding control unit 205, redundancy encoder 201b adjusts its operation e.g. to provide more redundancy bits per frame relative to the number of payload bits, which remains constant. The source encoding applied to the media data remains unchanged. Thus, media encoder 201 starts producing a second encoded media stream having an unchanged (first) quality level and an increased level of redundancy. The second encoded media stream is provided from media encoder 201 to transmitter 207 via output line 203 and transmitter 207 starts to transmit the second encoded media stream.

In an embodiment, the redundancy encoder may, for example, increase the redundancy level by applying a secondary encoding operation. In this case, the redundancy encoder 201b applies the secondary encoding operation to the first encoded media stream to produce a second encoded media stream comprising more redundancy bits than the first one. In one embodiment, redundancy encoder 201b increases the level of redundancy by changing a parameter of the redundancy encoding applied in the redundancy encoder 201b, so that the number of redundancy bits is increased while the number of payload bits is maintained constant. For example, redundancy encoder 201b may increase the number of redundancy bits it produces from one third of the number of payload bits to two thirds, or four thirds.

In block 403, encoding control unit 205 determines whether the bandwidth used to convey the encoded media stream encoded at the first quality level and additional redundancy exceeds a minimum bandwidth that would be used to convey the media stream encoded at a higher quality level. The checking may be done by the comparator unit 205b of the encoding control unit 205, for example. More specifically, comparator 205b may check whether the bandwidth used by the payload encoded at the first quality level and increased level of redundancy is greater than the bandwidth that would be used if the media stream were encoded at a higher quality level with a lower number of redundancy bits, for example zero redundancy bits.

In block 403 the encoding control unit 205 also checks if transmission of the encoded media stream at the first quality level and increased level of redundancy is proceeding at an acceptable rate of errors. (Errors may comprise bit errors and/or packet losses, for example.) This check may be performed by error rate determination unit 205a, for example. An error rate is obtained and compared to a predetermined threshold error rate. If the observed rate of errors is lower than the threshold level, encoding control unit 205 concludes the path is performing adequately for transmission of encoded media data at a bandwidth equal to or less than the total bandwidth used to transmit the encoded media stream at the first quality level and increased level of redundancy.

An estimate of the error rate may be obtained in various ways. As described in connection with FIG. 2, encoding control apparatus 205 may be coupled to transmitter 207, which is used to transmit the encoded media stream. A processor or processing means coupled to or comprised in the transmitter may estimate the error rate from a distribution of received positive and negative acknowledgements. A negative acknowledgement is a message received at the transmitter from a corresponding receiver of the encoded media stream, indicating, for example, that a particular packet of transmitted media data was not received successfully. Alternatively, the encoding control unit 205 may be configured to receive an indication of bit error rate, BER, from a receiving device via the transmitter 207. BER indicates a ratio of correctly received bits to incorrectly received bits. Bits lost due to the loss of an entire packet may count as incorrectly received. Error-control encoding can be used in the receiver to detect errors. Since encoding can also be used to correct at least some errors, BER may be calculated either before error correction or after it. BER calculated before error correction is sometimes called raw BER.

Returning to consideration of FIG. 4, in block 404, encoding control unit 205 may provide a control signal via control line 211 to switch the source encoder 201a of media encoder 201 to start encoding the media stream at the higher quality level. In particular, the encoding control unit may switch the source encoder to apply higher quality source coding to the media stream if the bandwidth used to transmit the media data encoded at the first quality level and increased level of redundancy is at least sufficient to transmit the media data encoded at the higher quality level and the communication path is performing adequately in terms of error rate. Responsive to the control signal, source encoder 201a changes the source encoding applied to the media data to the higher quality level. Source encoder 201a may change at least one parameter of the source encoding applied to the media stream to produce an encoded media stream at the higher quality level. The encoding may be changed to the higher quality level so that the bandwidth used is not increased in the switch, for example by reducing the number of redundancy bits per frame added by redundancy encoder 201b.

If the encoding control unit determines that the bandwidth used to transmit the media data encoded at the first quality level and increased level of redundancy is less than what would be used were the media stream encoded at the higher quality level, or if the path is not performing adequately, the quality level may be kept unchanged, block 405. In a situation where the bandwidth used does exceed a minimum sufficient for source encoding at the higher quality level, but the path is not performing adequately, encoding control unit 205 may send a control signal to redundancy encoder 201b of media encoder 201 via control line 211 to reduce the redundancy level of the original encoded media stream (that encoded at the first quality level). In this case, the path may not be capable of supporting communications at the higher quality level, but may be able to support transmission of the encoded media stream at the first quality level and the original level of redundancy.

The method flow chart of FIG. 4 will now be described in connection with the embodiment of apparatus for probing transmission capacity illustrated in FIG. 3.

In block 401, media encoder 301, starts encoding media data received at input 302 into a first encoded media stream having a first quality level. The source encoded media stream is provided to redundancy encoder 309 via output 303. Redundancy encoder 309 applies a first level of redundancy to the encoded media stream. The first level of redundancy may be defined by adding a first predetermined number of redundancy bits to the encoded media data.

The first encoded media stream is provided from redundancy encoder 309 to transmitter 307 via output line 311. Transmitter 307 starts to transmit the first encoded media stream. A certain bandwidth is used to convey this media stream, which contains both payload and redundancy bits.

In block 402, encoding control unit 305 sends a command to redundancy encoder 309 via control line 313 to increase the redundancy level in the encoded media stream. Responsive to receiving the command from encoding control unit 305, redundancy encoder 309 adjusts its operation to provide more redundancy bits per frame relative to the number of payload bits, which remains constant.

In block 403, encoding control unit 305 determines whether the bandwidth used to convey the encoded media stream encoded at the first quality level and additional redundancy exceeds a minimum bandwidth that would be used to convey the encoded media stream encoded at a higher quality level. The checking may be done by the comparator unit 305b of the encoding control unit 305, for example. More specifically, comparator 305b may determine whether the bandwidth used by the payload encoded at the first quality level and increased level of redundancy is greater than the bandwidth that would be used if the media stream were encoded at a higher quality level with a lower number of redundancy bits, for example zero redundancy bits.

In block 403 the encoding control unit 305 also checks if transmission of the encoded media stream at the first quality level and increased level of redundancy is proceeding at an acceptable rate of errors. This check may be performed by error rate determination unit 305a, for example. An error rate is obtained and compared to a predetermined threshold error rate. If the observed rate of errors is lower than the threshold level, encoding control unit 305 concludes that the path is performing adequately for transmission of encoded media data at a bandwidth equal to or less than the total bandwidth used to transmit the encoded media stream at the first quality level and increased level of redundancy.

In block 404, encoding control unit 305 may provide a control signal via control line 315 to switch the media encoder 301 to start encoding the media stream at the higher quality level. In particular, the encoding control unit may switch the media encoder to apply higher quality source coding to the media stream if the bandwidth used to transmit the media data encoded at the first quality level and increased level of redundancy is at least sufficient to transmit the media data encoded at the higher quality level and the communication path is performing adequately in terms of error rate. Responsive to the control signal, media encoder 301 changes the source encoding applied to the media data to the higher quality level. Media encoder 301 may change at least one parameter of the source encoding applied to the media stream to produce an encoded media stream at the higher quality level. Encoding control unit may also instruct redundancy encoder 309 to reduce the level of redundancy applied to the media stream encoded at the higher quality data rate so that the total bandwidth used is not increased.

In a still further embodiment the increase in redundancy may be implemented in a transport protocol used to convey the encoded media stream. An example of a transport protocol that may be compatible with this embodiment is DCCP. This may be implemented, for example, in the transmitter 307 responsive to a control signal received from the encoding control unit 305 over connection 317.

If the encoding control unit determines that the bandwidth used to transmit the media data encoded at the first quality level and increased level of redundancy is less than what would be used were the media stream encoded at the higher quality level, or if the path is not performing adequately, the quality level may be kept unchanged, block 405. In a situation where the bandwidth used does exceed a minimum sufficient for source encoding at the higher quality level, but the path is not performing adequately, encoding control unit 305 may send a control signal to redundancy encoder 309 via control line 313 to reduce the redundancy level of the original encoded media stream (that encoded at the first quality level). In this case, the path may not be capable of supporting communications at the higher quality level, but may be able to support transmission of the encoded media stream at the first quality level and the original level of redundancy.

Using a process as described above, a node transmitting a coded media stream can probe a path to discover if it would be possible to switch to a higher quality level.

In an embodiment of the invention the redundancy level may be increased in stages, whereby a first increase in redundancy is followed by another increase, such that the level of redundancy, and consequently bandwidth use, is increased gradually. The number of stages may be two, three or more. This may be useful in gradually probing the capacity of the transmission path used to convey the encoded media stream. If the bandwidth used by the encoded media stream exceeds a bandwidth the path can support, errors in transmission or packet losses will occur, which may be detected using, for example, error-controlling methods in transport protocols or in lower layers.

Increasing the redundancy rate gradually in steps may allow a media encoder to interwork better with existing internet protocol (IP) networks. This is because transport protocols such as TCP, SCTP and DCCP increase their data rates gradually. IP networks may also be configured under an assumption that data flows gradually increase their demand for bandwidth. Also packet-switched or circuit-switched communication paths not using IP may be compatible with embodiments of the invention.

Changing the redundancy added to media streams in accordance with embodiments of the invention may also have the effect of reducing the burstiness of data produced by a media encoder. Data streams produced by media encoders may be bursty in nature, meaning that the bandwidth required to convey the stream may change significantly over relatively short periods of time. Embodiments of the invention allow a redundancy level to be modified so that variations in instantaneous bit rate may be reduced, thereby reducing variations in the bandwidth required to transmit the media stream. For example, the redundancy level may be increased responsive to a sharp decrease in the data rate produced by the encoder. Certain transport protocols, for example TCP, SCTP and DCCP, work better with data streams that are roughly constant in the sense that their bandwidth requirements do not fluctuate strongly. Another example is that a redundancy level may be decreased responsive to an increase in the data rate. In this example, the redundancy rate may subsequently be gradually increased if the data rate appears to be increased for a prolonged period of time.

Figure 5:
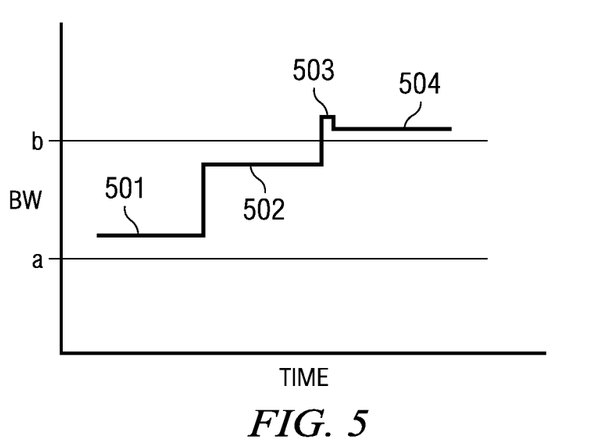
FIG. 5 is a graph illustrating bandwidth and redundancy levels associated with embodiments of the invention.

FIG. 5 is a graph illustrating bandwidth and redundancy levels associated with embodiments of the invention. The horizontal axis corresponds to advancing time, from left to right, and the vertical axis corresponds to increasing bandwidth, from bottom to top. Horizontal lines labeled a and b correspond to minimum bandwidths sufficient to transmit a media stream, in encoded form, at a first and a higher quality level, respectively. In a first phase, labeled 501, a media encoder implemented according to an embodiment of the invention encodes a media input into an encoded media stream at a first quality level and a first level of redundancy. In a second phase, labeled 502, the redundancy level is increased. In the example illustrated in FIG. 5, the redundancy is increased in two steps, but in other embodiments a different number of steps may be used.

In the example of FIG. 5, a first increase in redundancy results in a used bandwidth that is still lower than the bandwidth sufficient to transmit the media stream encoded at the higher quality level. After the second increase in redundancy, labeled 503, the bandwidth used exceeds the minimum sufficient to transmit the media stream at the higher quality level, labeled b. If the communication path performs adequately while using this bandwidth, for example the error rate on the communication path is acceptably low, the media encoder may be switched to use the higher quality level, 504.

Without in any way limiting the scope, interpretation, or application of the claims appearing below, it is possible that a technical advantage of one or more of the example embodiments disclosed herein may be that additional bits transmitted to probe a link provide redundancy to an encoded media stream that a decoder may use to improve the quality of decoded media data. Another possible technical advantage of one or more of the example embodiments disclosed herein may be to provide a media stream that varies less abruptly in its bandwidth requirements. Such a media stream may be better suited for transmission in IP packet networks that adapt well to gradual increases in bandwidth, as opposed to changing the required bandwidth suddenly by a large amount. A gradually increasing bandwidth may be accommodated by a network which adapts its routing to traffic patterns, for example.

Embodiments of the present invention may be implemented in software, hardware, application logic or a combination of software, hardware and application logic. The application logic, software or an instruction set is preferably maintained on any one of various conventional computer-readable media. In the context of this document, a "computer-readable medium" can be any media or means that can contain, store, communicate, propagate or transport the instructions for use by or in connection with an instruction execution system, apparatus, or device.

If desired, the different functions discussed herein may be performed in any order and/or concurrently with each other. Furthermore, if desired, one or more of the above-described functions may be optional or may be combined.

Although various aspects of the invention are set out in the independent claims, other aspects of the invention comprise any combination of features from the described embodiments and/or the dependent claims with the features of the independent claims, and not solely the combinations explicitly set out in the claims.

It is also noted herein that while the above describes exemplifying embodiments of the invention, these descriptions should not be viewed in a limiting sense. Rather, there are several variations and modifications which may be made without departing from the scope of the present invention as defined in the appended claims.

What is claimed is:

1. An apparatus, comprising:
   at least one processor; and
   at least one memory including computer program code,
      where the at least one memory and the computer program code are configured, with the at least one processor, to cause the apparatus to at least:
         instruct a redundancy encoder to increase a level of forward error control redundancy of an encoded media stream gradually in steps from an initial level to an increased level and
         to convey the encoded media stream at a first quality level with the initial level of redundancy and with the increased level of redundancy of that step;
         determine at each of the steps an error rate including at least a bit error rate and distribution of positive and negative acknowledgements of a communication path conveying the encoded media stream at the first quality level with the increased level of the forward error control redundancy of that step;
         compare at each of the steps a bandwidth used to convey the encoded media stream at the first quality level with the initial level of the forward error control redundancy with a bandwidth needed to convey the encoded media stream at the first quality level with the increased level of the forward error control redundancy of each of the steps; and
         based on at least the error rate,
            determining that the used bandwidth at a last step of the steps being is sufficient for conveying the media stream encoded at the increased level of the forward error control redundancy of that step and
            the determined error rate at the last step being is less than a predetermined threshold value,
            provide a switching signal to a media encoder to start increasing a rate of encoding the media stream using a portion of the increased level of the forward error control redundancy of the last step so that a total bandwidth used to convey the increased rate encoded media stream with the forward error control redundancy is not increased.

2. The apparatus of claim 1, wherein the redundancy encoder and media encoder are the same unit.

3. The apparatus of claim 1, wherein the redundancy encoder and media encoder are separate units.

4. The apparatus of claim 1, wherein the quality level is a level of at least one of: video flame rate, sampling rate and resolution.

5. The apparatus of claim 1, wherein the error rate is further determined from a frame error rate.

6. The apparatus of claim 1, wherein the error control unit is configured to increase the level of forward error control redundancy in stages, wherein the forward error control redundancy is increased more than once to increase the bandwidth used to a level which exceeds the minimum needed to convey the media stream at the first quality level with the increased level of redundancy.

7. The apparatus of claim 1, wherein the increasing is done by effecting a change in an encoding parameter in the redundancy encoder.

8. The apparatus of claim 1, wherein the increasing is done by effecting a change in an encoding parameter in a media transport protocol.

9. An encoder comprising an apparatus according to claim 1.

10. The non-transitory computer-readable medium of claim 9, wherein increasing the level of redundancy is done in stages, wherein the forward error control redundancy is increased more than once to increase the bandwidth used to a level which exceeds the minimum needed to convey the media stream at the first quality level with the increased level of forward error control redundancy.

11. A method, comprising:
   instructing, by an apparatus,
      a redundancy encoder to increase a level of forward error control redundancy of an encoded media stream gradually in steps from an initial level to an increased level and to convey the encoded media stream at a first quality level with the initial level of redundancy and with the increased level of redundancy;
   determining, by the apparatus,
      at each of the steps an error rate including at least a bit error rate and distribution of positive and negative acknowledgements of a communication path conveying the encoded media stream at the first quality level with the increased level of redundancy at that step;
   comparing, by the apparatus,
      at each of the steps a bandwidth used to convey the encoded media stream at the first quality level with the initial level of forward error control redundancy with a bandwidth used to convey the encoded media stream at the first quality level with the increased level of forward error control redundancy of each of the steps;
      based on at least the error rate, determining that the used bandwidth at a last step of the steps being sufficient for conveying the media stream encoded at the first quality level with the increased level of the forward error control redundancy of that step and
      the determined error rate is less than a predetermined threshold value, and
   providing a switching signal to a media encoder to start increasing a rate of encoding the media stream using a portion of the increased level of the forward error control redundancy of the last step so that a total bandwidth used to convey the increased rate encoded media stream with the forward error control redundancy is not increased.

12. The method of claim 11, wherein the redundancy encoder and media encoder are the same unit.

13. The method of claim 11, wherein the redundancy encoder and media encoder are separate units.

14. The method of claim 11, wherein the quality level is a level of at least one of: video flame rate, sampling rate and resolution.

15. The method of claim 11, wherein the error rate is further determined from a frame error rate.

16. The method of claim 11, wherein the level of forward error control redundancy is increased in stages, wherein the forward error control redundancy is increased more than once to increase the bandwidth used to a level which exceeds the minimum needed to convey the media stream at the first quality level with the increased level of redundancy.

17. The method of claim 11, wherein the increasing is done by effecting a change in an encoding parameter in the redundancy encoder.

18. The method of claim 11, wherein the increasing is done by effecting a change in an encoding parameter in a media transport protocol.

19. The method according to claim 11, further comprising:
  detecting a change in a data rate output associated with the encoded media stream by a codec; and responsive to the change in data rate, modifying the forward error control redundancy level, wherein the forward error control redundancy level is increased responsive to the data rate declining.

20. The method of claim 19, further comprising that the forward error control redundancy level is decreased responsive to the data rate increasing.

21. A non-transitory computer-readable medium bearing computer program code embodied therein for use with a computer,
  the computer program code executable to perform operations comprising:
  instructing a redundancy encoder to increase a level of forward error control redundancy of an encoded media stream from an initial level to an increased level and
  to convey the encoded media stream at a first quality level with the initial level of redundancy and with the increased level of redundancy;
  determining at each of the steps an error rate including at least a bit error rate and distribution of positive and negative acknowledgements of a communication path conveying the encoded media stream with increased forward error control redundancy of that step;
  comparing at each of the steps a bandwidth used to convey the encoded media stream at the first quality level with a bandwidth used to convey the encoded media stream at the first quality level with the increased level of forward error control redundancy of each of the steps;
  and based on at least the error rate
    determining that the used bandwidth at a last step of the steps is sufficient for conveying the media stream encoded at the increased level of forward error control redundancy of that step and
    the determined error rate at the last step being is less than a predetermined threshold value, and
  providing a switching signal to a media encoder to start increasing a rate of encoding the media stream using a portion of the increased level of forward error control redundancy of the last step so that a total bandwidth used to convey the increased rate encoded media stream with the forward error control redundancy is not increased.

* * * * *